United States Patent
Kamimura et al.

(10) Patent No.: US 9,666,836 B2
(45) Date of Patent: May 30, 2017

(54) ORGANIC EL DEVICE

(71) Applicant: Japan Display Inc., Minato-ku (JP)

(72) Inventors: Takaaki Kamimura, Tokyo (JP);
Noriyuki Hirata, Tokyo (JP)

(73) Assignee: Japan Display Inc., Minato-ku (JP)

( * ) Notice: Subject to any disclaimer, the term of this patent is extended or adjusted under 35 U.S.C. 154(b) by 0 days.

(21) Appl. No.: 14/708,597

(22) Filed: May 11, 2015

(65) Prior Publication Data

US 2015/0333112 A1   Nov. 19, 2015

(30) Foreign Application Priority Data

May 13, 2014  (JP) ................................. 2014-099524

(51) Int. Cl.
*H01L 51/52* (2006.01)
*H01L 27/32* (2006.01)
*H01L 51/56* (2006.01)

(52) U.S. Cl.
CPC ........ *H01L 51/529* (2013.01); *H01L 27/3248* (2013.01); *H01L 51/5271* (2013.01); *H01L 51/56* (2013.01); *H01L 2227/323* (2013.01)

(58) Field of Classification Search
CPC ............................ H01L 27/3248; H01L 51/529
See application file for complete search history.

(56) References Cited

U.S. PATENT DOCUMENTS

| | | | | |
|---|---|---|---|---|
| 7,166,959 B2 * | 1/2007 | Suzuki | ................ | H01L 27/3213 313/504 |
| 7,498,738 B2 * | 3/2009 | Nishikawa | .......... | H01L 51/5265 313/504 |
| 7,977,874 B2 * | 7/2011 | Matsuura | ............ | H01L 27/3244 313/503 |
| 8,143,708 B2 * | 3/2012 | Oikawa | .................. | H01L 23/295 257/678 |
| 8,357,997 B2 * | 1/2013 | Kubota | ............... | H01L 51/5048 257/642 |
| 9,024,525 B2 * | 5/2015 | Furuie | .................. | H01L 51/5284 313/503 |
| 9,196,593 B2 * | 11/2015 | Yakubo | ............ | G06K 19/07749 |
| 2004/0256979 A1 * | 12/2004 | Murakami | .......... | H01L 27/3248 313/503 |

(Continued)

FOREIGN PATENT DOCUMENTS

JP    07-146490    6/1995
JP    08-330594   12/1996

(Continued)

*Primary Examiner* — Caridad Everhart
*Assistant Examiner* — Ankush Singal
(74) *Attorney, Agent, or Firm* — Oblon, McClelland, Maier & Neustadt, L.L.P.

(57) ABSTRACT

According to one embodiment, an organic EL device includes an insulating substrate including a first main surface and a second main surface, a switching element formed on the insulating substrate at the first main surface side, a first electrode electrically connected to the switching element, a second electrode opposed to the first electrode, an organic luminescent layer disposed between the first electrode and the second electrode, a reflective plate disposed between the insulating substrate and the first electrode, and a conductive film covering the second main surface of the insulating substrate.

10 Claims, 6 Drawing Sheets

(56) References Cited

U.S. PATENT DOCUMENTS

| | | | |
|---|---|---|---|
| 2005/0127820 A1* | 6/2005 | Yamazaki | H01L 51/5281 313/501 |
| 2005/0230684 A1* | 10/2005 | Seo | H01L 27/3248 257/72 |
| 2006/0043359 A1* | 3/2006 | Masuda | B82Y 10/00 257/40 |
| 2007/0024187 A1* | 2/2007 | Shin | H01L 51/5281 313/504 |
| 2007/0181875 A1* | 8/2007 | Yamazaki | G06K 19/07749 257/40 |
| 2008/0211394 A1* | 9/2008 | Koshihara | G06F 3/044 313/504 |
| 2008/0224940 A1* | 9/2008 | Sugiyama | H01L 23/145 343/873 |
| 2009/0085182 A1* | 4/2009 | Yamazaki | H01L 23/295 257/679 |
| 2009/0289341 A1* | 11/2009 | Yamazaki | G06K 19/07735 257/679 |
| 2010/0026178 A1* | 2/2010 | Hwang | H01L 51/5215 313/506 |
| 2014/0070177 A1* | 3/2014 | Kim | H01L 27/3223 257/40 |

FOREIGN PATENT DOCUMENTS

| | | |
|---|---|---|
| JP | 10-149890 | 6/1998 |
| JP | 10-275775 | 10/1998 |

\* cited by examiner

ORGANIC EL DEVICE

CROSS-REFERENCE TO RELATED APPLICATIONS

This application is based upon and claims the benefit of priority from Japanese Patent Application No. 2014-099524, filed May 13, 2014, the entire contents of which are incorporated herein by reference.

FIELD

Embodiments described herein relate generally to an organic EL device and a manufacturing method of the same.

BACKGROUND

In a manufacturing process of display devices such as a liquid crystal display device and an organic electroluminescence (EL) display device, an electrostatic charge which occurs during the manufacturing process may cause destruction of the device. To prevent the destruction, various countermeasures are adopted. As an example of such a countermeasure, there is a known technique to form a transparent conductive film on a rear surface of an insulating substrate, that is, on a surface opposed to a surface on which a thin-film transistor or the like are formed.

DETAILED DESCRIPTION

In general, according to one embodiment, an organic EL device comprises: an insulating substrate including a first main surface and a second main surface; a switching element formed on the insulating substrate at the first main surface side; a first electrode electrically connected to the switching element; a second electrode opposed to the first electrode; an organic luminescence layer disposed between the first electrode and the second electrode; a reflective plate disposed between the insulating substrate and the first electrode; and a conductive film covering the second main surface of the insulating substrate.

According to another embodiment, a manufacturing method of an organic EL device comprises: disposing a mother substrate on a supporting substrate with a conductive film interposed therebetween; forming a switching element, reflective plate, and display element unit on the mother substrate, the display element unit including an organic EL element positioned above the switching element and the reflective plate; and removing the supporting substrate from the mother substrate.

Embodiments are described with reference to accompanying drawings. Note that the disclosure is presented for the sake of exemplification, and any modification and variation conceived within the scope and spirit of the invention by a person having ordinary skill in the art are naturally encompassed in the scope of invention of the present application. Furthermore, a width, thickness, shape, and the like of each element are depicted schematically in the Figures as compared to actual embodiments for the sake of simpler explanation, and they are not to limit the interpretation of the invention of the present application. Furthermore, in the description and Figures of the present application, structural elements having the same or similar functions will be referred to by the same reference numbers and detailed explanations of them that are considered redundant may be omitted.

In the present embodiment, an organic electroluminescence (EL) device is an organic EL display device. However, no limitation is intended thereby, and the organic EL device may be an organic EL illumination device or an organic EL printer head, for example.

Figure 1:
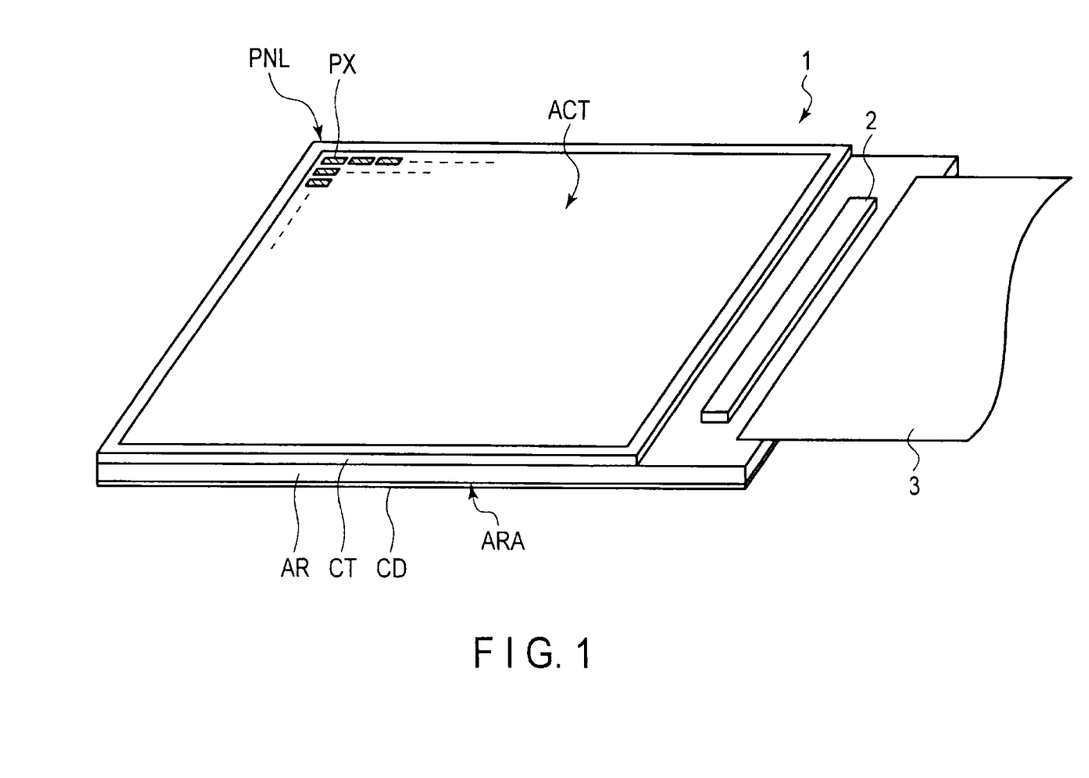
FIG. 1 schematically shows the structure of an organic EL device 1 of an embodiment.

FIG. 1 schematically shows the structure of an organic EL device 1 of the present embodiment. Note that only the main parts of the structure which are necessary for the explanation are depicted therein.

That is, the organic EL device 1 includes a substantially rectangular flat-panel display panel PNL, and a driving IC chip 2 and a flexible printed circuit board 3 connected to the display panel PNL.

The display panel PNL includes an array substrate AR and a counter-substrate CT opposed to the array substrate AR. Between the array substrate AR and the counter-substrate CT, a filler may be disposed, or an evacuated space or a space filled with inert gas may be formed. As described later, the array substrate AR includes an organic EL element and the like. Furthermore, the array substrate AR includes a conductive film CD on its rear surface ARA, that is, on a surface opposed to the surface facing the counter-substrate CT. The counter-substrate CT may be a shield substrate which shields the organic EL element or may be a cover glass of an electronic device with the organic EL device 1 incorporated. The organic EL device 1 may include a touch-panel which detects contact or approach of an object to the surface of the cover glass.

The display panel PNL includes an active area ACT which displays images. The active area ACT is formed in, for example, a quadrangle and is composed of a plurality of pixels PX arranged in an m×n matrix (m and n are a positive integer). Each pixel PX may be composed of three sub-pixels of red, green, and blue, or may be composed of four sub-pixels of red, green, blue, and, for example, white. Each sub-pixel includes an organic EL element.

The driving IC chip 2 and the flexible printed circuit board 3 are mounted on the array substrate AR outside the active area ACT and function as signal suppliers which supply signals necessary for drive of the pixels PX.

Figure 2:
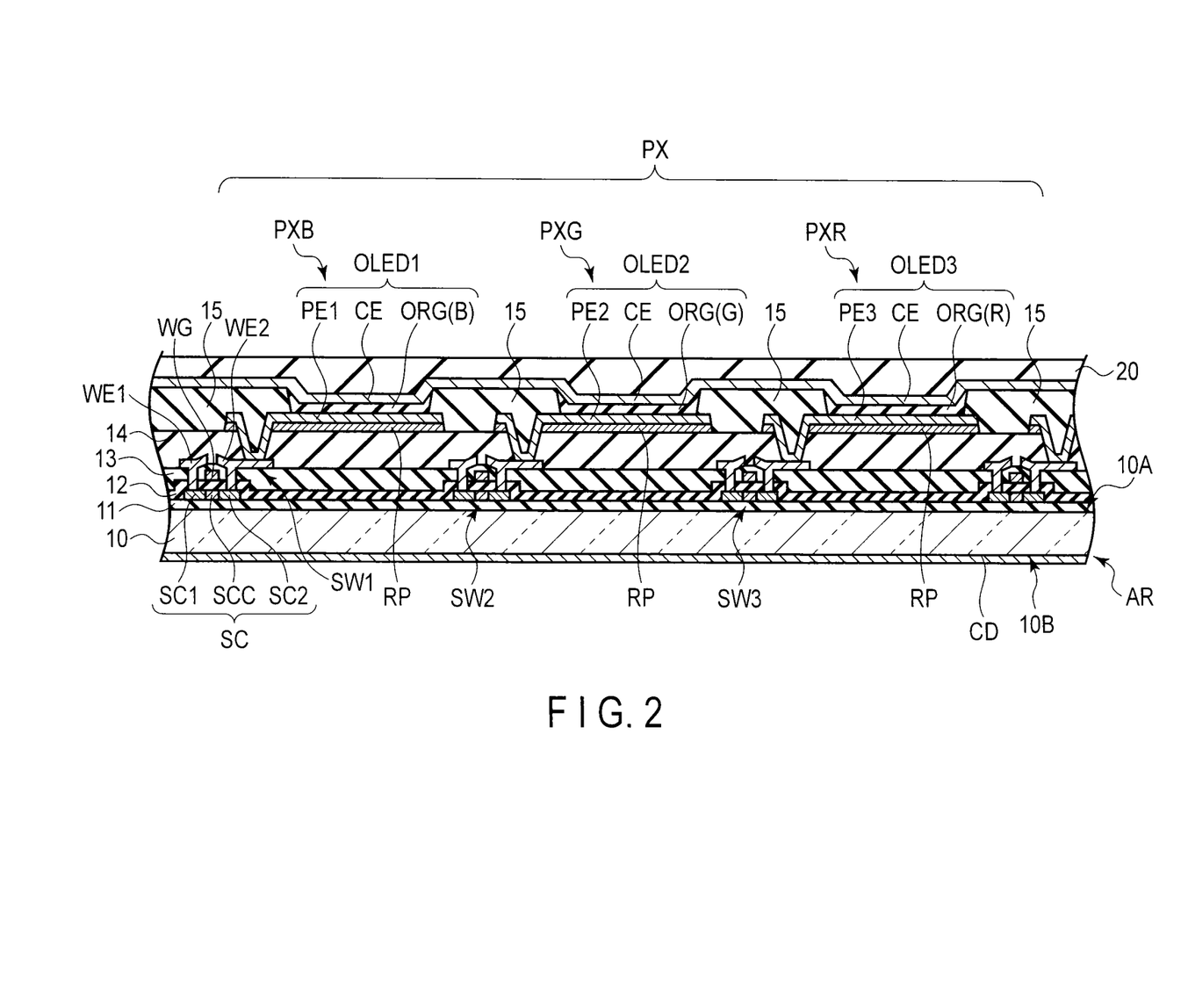
FIG. 2 is a cross-sectional view which schematically shows a structural example of an array substrate AR which is applicable to the organic EL device 1 in FIG. 1.

FIG. 2 is a cross-sectional view which schematically shows a structural example of the array substrate AR which is applicable to the organic EL device 1 shown in FIG. 1.

The array substrate AR may be formed of a first insulating substrate 10. The first insulating substrate 10 may be glass substrate or resin substrate. The resin substrate is formed of, for example, polyimide, polyethylene terephthalate, polyethylene naphthalate, polycarbonate, and polyether sulfone. The first insulating substrate 10 has a first main surface (inner surface) 10A and a second main surface (outer surface) 10B. The second main surface 10B corresponds to the rear surface ARA of the array substrate AR.

The array substrate AR includes, at the first main surface 10A side of the first insulating substrate 10, a first insulating film 11, a second insulating film 12, a third insulating film 13, a fourth insulating film 14, a bank 15, switching elements SW1 to SW3, a reflective plate RP, organic EL elements OLED1 to OLED3, and a sealing film 20. Furthermore, the array substrate AR includes a conductive film CD at the second main surface 10B side of the first insulating substrate 10.

The first main surface 10A of the first insulating substrate 10 is covered with the first insulating film 11. The first insulating film 11 is formed of an inorganic material such as silicon nitride (SiN), silicon oxide (SiO), and silicon oxynitride (SiON), and is a monolayer or a multilayer.

The switching elements SW1 to SW3 are formed on the first insulating film 11. The switching element SW1 is disposed on the blue pixel PXB, the switching element SW2 is disposed on the green pixel PXG, and the switching element SW3 is disposed on the red pixel PXR. Each of switching elements SW1 to SW3 is, for example, a thin-film transistor (TFT) including a semiconductor layer SC. The switching elements SW1 to SW3 are structured the same, and in the following description, the switching element SW1 is focused to explain its detailed structure.

In the example depicted, the switching element SW1 is of the top-gate type and includes a semiconductor layer SC formed of polycrystalline silicon (p-Si). Note that the semiconductor layer SC may be formed of amorphous silicon (a-Si) or oxide semiconductor. The switching element SW1 may be of the bottom-gate type. Here, a top-gate thin-film transistor usable as a switching element can reduce the parasitic capacitance better as compared to a bottom-gate thin-film transistor, and thus is more suitable.

The semiconductor layer SC includes a channel region SCC, and a first impurity region SC1 and a second impurity region SC2 containing more impurities than the channel region SCC. The channel region SCC is disposed between the first impurity region SC1 and the second impurity region SC2. Furthermore, the channel region SCC is a region whose resistance is higher than that of the first impurity region SC1 and the second impurity region SC2. The semiconductor layer SC is formed on the first insulating film 11 and is covered with the second insulating film 12. The second insulating film 12 is disposed on the first insulating film 11. Such a second insulating film 12 is formed of an inorganic material such as silicon oxide.

A gate electrode WG of the witching element SW1 is formed on the second insulating film 12 and is disposed immediately above the channel region SCC. The gate electrode WG is formed of a metal such as molybdenum (Mo), tungsten (W), aluminum (Al), titanium (Ti), and copper (Cu), or of an alloy containing these metals. In this example, the gate electrode WG is formed of molybdenum tungsten (MoW). The gate electrode WG is covered with the third insulating film 13. The third insulating film 13 is disposed on the second insulating film 12. The third insulating film 13 is formed of an inorganic material such as silicon nitride or silicon oxide.

The first electrode WE1 and the second electrode WE2 of the switching element SW1 are formed on the third insulating film 13. The first electrode WE1 is electrically connected to the first impurity region SC1 of the semiconductor layer SC, and the second electrode WE2 is electrically connected to the second impurity region SC2 of the semiconductor layer SC. The first electrode WE1 and the second electrode WE2 are formed of a metal such as molybdenum (Mo), tungsten (W), aluminum (Al), titanium (Ti), and copper (Cu) or of an alloy containing these metals. In this example, the first electrode WE1 and the second electrode WE2 are formed of a multilayer of aluminum and titanium. The first electrode WE1 and the second electrode WE2 are covered with the fourth insulating film 14. The fourth insulating film 14 is disposed on the third insulating film 13. The fourth insulating film 14 is formed of a resin material such as acrylic resin.

The organic EL elements OLED1 to OLED3 are formed on the fourth insulating film 14. The organic EL element OLED1 is disposed on a blue pixel PXB and is electrically connected to the switching element SW1. The organic EL element OLED2 is disposed on a green pixel PXG and is electrically connected to the switching element SW2. The organic EL element OLED3 is disposed on a red pixel PXR and is electrically connected to the switching element SW3. Each of the organic EL elements OLED1 to OLED3 are self-luminescent element of the top-emission type which emits light toward the sealing film 20 side, and emits light of different colors.

The banks 15 are formed on the fourth insulating film 14 to define the organic EL elements OLED1 to OLED3. Note that, although this is not described in detail, the banks 15 are formed on the fourth insulating film 14 in a lattice or stripes, for example.

The organic EL element OLED1 includes a pixel electrode (first electrode) PE1, a common electrode (second electrode) CE opposed to the pixel electrode PE1, and an organic luminescent layer ORG(B) disposed between the pixel electrode PE1 and the common electrode CE. The organic EL element OLED2 includes a pixel electrode PE2, the common electrode CE opposed to the pixel electrode PE2, and an organic luminescent layer ORG(G) disposed between the pixel electrode PE2 and the common electrode CE. The organic EL element OLED3 includes a pixel electrode PE3, the common electrode CE opposed to the pixel electrode PE3, and an organic luminescent layer ORG(R) disposed between the pixel electrode PE3 and the common electrode CE.

The pixel electrode PE1 is electrically connected to the switching element SW1. The pixel electrode PE2 is electrically connected to the switching element SW2. The pixel electrode PE3 is electrically connected to the switching element SW3. Each edge of the pixel electrodes PE1 to PE3 is covered with the bank 15. The pixel electrodes PE1 to PE3 are formed of a transparent material such as indium tin oxide (ITO) and indium zinc oxide (IZO).

The reflective plate RP is disposed between the first insulating substrate 10 and the pixel electrodes PE1 to PE3. In the example depicted, the reflective plates RP are formed in islands on the fourth insulating film 14 to overlap the pixel electrodes PE1 to PE3, individually. The reflective plate RP is formed of a highly reflective metal such as aluminum (Al), magnesium (Mg), silver (Ag), and titanium (Ti). Note that the reflective plates RP may be disposed at any position between the first insulating substrate 10 and the pixel electrodes PE1 to PE3. However, in consideration of the emitting light from the organic EL elements OLED1 to OLED3 reaching the switching elements SW1 to SW3 which causes a malfunction of the switching elements SW1 to SW3 and the like, the reflective plates RP should preferably be disposed to be closer to the pixel electrodes PE1 to PE3. For example, the reflective plates RP should preferably be disposed between the switching elements SW1 to SW3 and the pixel electrodes PE1 to PE3, or may be disposed to cover the switching elements SW1 to SW3.

The organic luminescent layer ORG(B) contains a dopant material which emits blue light. The organic luminescent layer ORG(G) contains a dopant material which emits green light. The organic luminescent layer ORG(R) contains a dopant material which emits red light. The organic luminescent layers ORG(B), ORG(G), and ORG(R) break off by the banks 15.

The common electrode CE is formed continuously over the organic EL elements OLED1 to OLED3 without a break, and covers the banks 15 exposed from the organic luminescent layers. The common electrode CE is formed of a transparent conductive material such as ITO and IZO. The common electrode CE may be a semitransparent film formed of magnesium (Mg) and silver (Ag), instead.

Note that, in organic EL elements OLED1 to OLED3, a hole injection layer or a hole transportation layer may additionally be interposed between the pixel electrode PE1 to PE3 and the organic luminescent layers ORG(B), ORG(G), and ORG(R). Furthermore, an electron injection layer and an electron transportation layer may additionally be interposed between the organic luminescent layers ORG(B), ORG(G), and ORG(R) and the common electrode CE.

The sealing film 20 seals the organic EL elements OLED1 to OLED3. The sealing film 20 protects the organic EL elements OLED1 to OLED3 from moisture and oxygen. The sealing film 20 is formed of a transparent and highly water-resistant material. For example, the sealing film 20 is a multilayer of inorganic thin films formed of an inorganic material and organic thin films formed of an organic material layered one after another.

The conductive film CD covers the rear surface of the array substrate AR, that is, the second main surface 10B of the first insulating substrate 10. The conductive film CD may be formed of various kinds of metals, metal compounds, alloys, conductive organic materials, or transparent conductive materials such as ITO. For example, the conductive film CD may be formed of a material containing a high-melting-point metal. Specifically, the conductive film CD can be formed of a high-melting-point metal nitride or a high-melting-point metal oxide. The high-melting-point metal may be tungsten, tantalum, molybdenum, or niobium, or an alloy containing these elements. The conductive film CD formed of a material containing a high-melting-point metal can prevent its deformation and melting during a manufacturing process performed in a high temperature environment. Note that, in general, nitride possesses better conductivity as compared to oxide. Furthermore, since oxide easily reacts with a gas such as hydrogen, it would affect manufacturing process of the array substrate AR in various ways. From these standpoints, the conductive film CD should preferably be formed of a high-melting-point metal nitride.

According to the organic EL device 1 as above, when each of organic EL elements OLED1 to OLED3 emits light, the light emitted therefrom travels outward passing through the sealing film 20. From the blue pixel PXB, the organic EL element OLED1 emits blue light. From the green pixel PXG, the organic EL element OLED2 emits green light. From the red pixel PXR, the organic EL element OLED3 emits red light. Therefore, color display is achieved.

Note that the structure of the array substrate AR is not limited to the example described above. For example, if the pixel PX additionally includes a white Sub-pixel, the white sub-pixel may include an organic EL element having an organic luminescent layer which emits white light, or may include the organic EL elements OLED1 to OLED3 described above.

Furthermore, as the array substrate AR, an organic luminescent layer formed continuously over the organic EL elements OLED1 to OLED3 without a break and emitting white light can be adopted. If such an array substrate AR is adopted, the color filters opposed to the organic EL elements OLED1 to OLED3 are used to achieve the color display.

Now, the manufacturing method of the organic EL element 1 is explained with reference to FIGS. 3 to 7.

Figure 3:
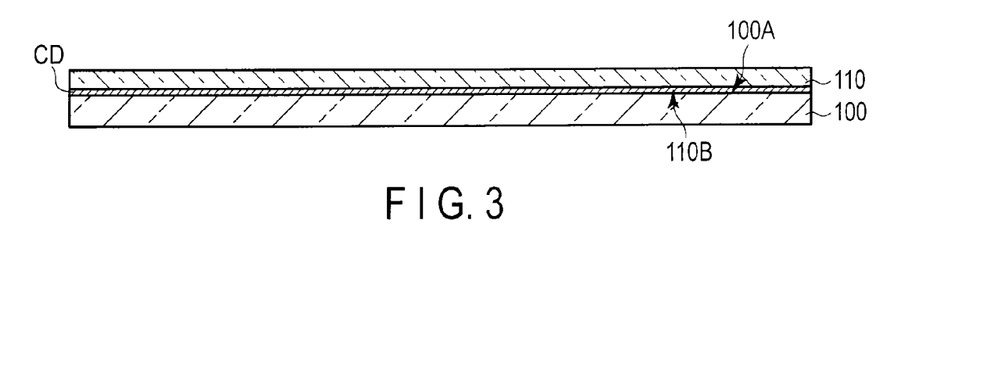
FIG. 3 shows a manufacturing method of the organic EL device 1 and shows that a conductive film CD is interposed between a supporting substrate 100 and a mother substrate 110.

Initially, as shown in FIG. 3, a mother substrate 110 is disposed on a supporting substrate 100 with the conductive film CD interposed therebetween. The supporting substrate 100 is glass substrate, for example. The mother substrate 110 corresponds to the first insulating substrate 10, and may be glass substrate or resin substrate. The conductive film CD is formed on the main surface 110B of the mother substrate 110, or may be formed on the main surface 100A of the supporting substrate 100, or may be sandwiched between the supporting substrate 100 and the mother substrate 110. Specific materials for the conductive film CD are exemplified above.

Figure 4:
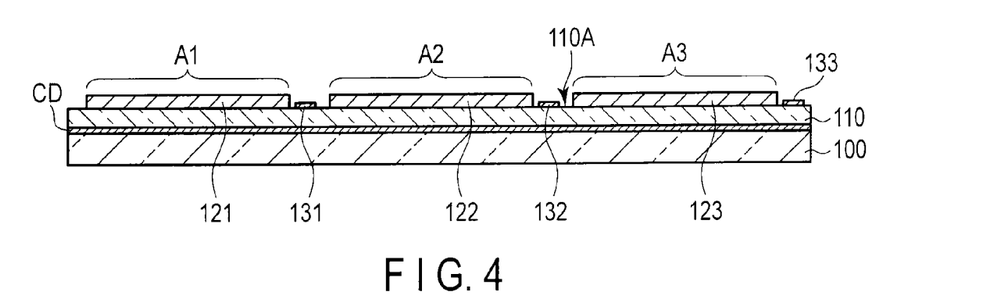
FIG. 4 shows the manufacturing method of the organic EL device 1 and shows a process of forming display element units 121 to 123 and mount units 131 to 133.

Then, as shown in FIG. 4, display element units 121 to 123 are formed on the main surface 110A of the mother substrate 110. For example, a display element unit 121 is formed in a first area A1 on the mother substrate 110, a display element unit 122 is formed in a second area A2 on the mother substrate 110, and a display element unit 123 is formed in a third area A3 on the mother substrate 110. Through the process to form the display element units 121 to 123, mount units 131 to 133 are also formed on the mother substrate 110. The first area A1, second area A2, and third area A3 are apart from each other, and they correspond to the active areas in the chips formed after dividing the mother substrate 110. The display element units 121 to 123 have the same structure and each include a plurality of organic EL elements arranged in a matrix. Furthermore, the mount units 131 to 133 have the same structure and include a plurality of pads on which signal suppliers such as the driving IC chip 2 and the flexible printed circuit board 3 are mounted later.

Each of the display element units 121 to 123 is structured as shown in FIG. 2. In this example, the display element units 121 to 123 are formed in the following manner. That is, the first insulating film 11 is formed on the mother substrate 110, and then, the switching elements SW1 to SW3, the second insulating film 12, the third insulating film 13, and the fourth insulating film 14 are formed above the first insulating film 11. In the process of forming these switching elements SW1 to SW3, various wirings are formed concurrently. Then, the reflective plate RP is formed on the fourth insulating film 14, and the pixel electrodes PE1 to PE3 of the organic EL elements OLED1 to OLED3, the banks 15, the organic luminescent layers ORG of the organic EL elements OLED1 to OLED3, the common electrode CE, and the sealing film 20 are formed sequentially. After that, the counter-substrate may be adhered to the display element units 121 to 123; however, the explanation of counter-substrate is irrelevant and thus omitted.

Note that the organic luminescent layers ORG(B), ORG(G), and ORG(R) can be formed individually through the following process. That is, if the organic luminescent layers are formed of a polymeric material, an inkjet process or the like is applicable. Or, if the organic luminescent layers are formed of a low molecular material, a vapor deposition process or the like is applicable.

Figure 5:
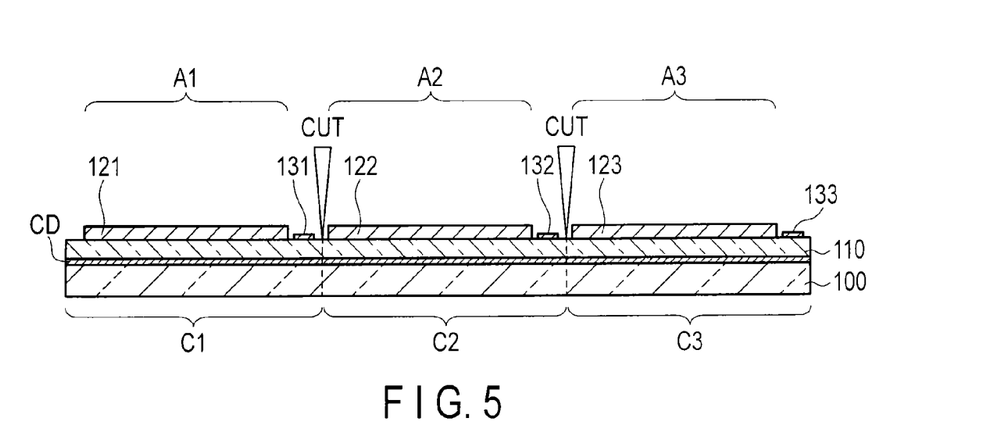
FIG. 5 shows the manufacturing method of the organic EL device 1 and shows a process of dividing the mother substrate 110.

Then, as shown in FIG. 5, the mother substrate 110 is divided. In the example depicted, the mother substrate 110 is divided along with the supporting substrate 100 at the position between the mount unit 131 and the display element unit 122, and the position between the mount unit 132 and the display element unit 123. Especially, if the mother substrate 110 is resin substrate or very thin glass substrate, the mother substrate 110 and the supporting substrate 100 should preferably be formed integrally to easily handle the mother substrate 110. Though the above, a chip C1 including the display element unit 121 and the mount unit 131, a chip C2 including the display element unit 122 and the mount unit 132, and a chip C3 including the display element unit 123 and the mount unit 133 are formed individually.

Figure 6:
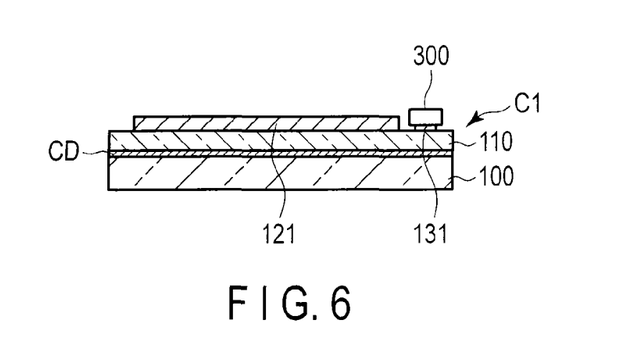
FIG. 6 shows the manufacturing method of the organic EL device 1 and shows a process of mounting a signal supplier 300 on the mount unit 131.

Then, as shown in FIG. 6, a signal supplier 300 is mounted on the mount unit 131 of the chip C1. At that time, the chip C1 can be sufficiently supported by the remaining supporting substrate 100 against the pressure force applied when the signal supplier 300 is mounted. Note that, although this is not described in detail, signal suppliers are mounted on the mount unit 132 of the chip C2 and on the mount unit 133 of the chip C3 in a similar manner.

Figure 7:
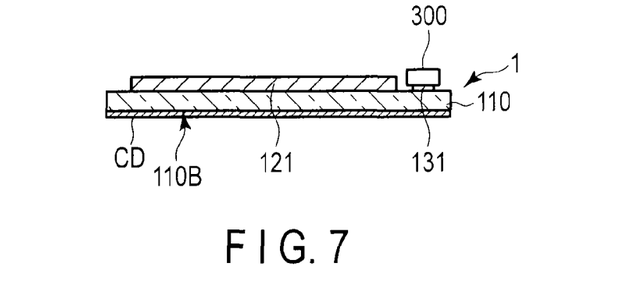
FIG. 7 shows the manufacturing method of the organic EL device 1 and shows a process of removing the supporting substrate 100 from the mother substrate 110.

Then, as shown in FIG. 7, the supporting substrate 100 is removed from the mother substrate 110 with respect to the chip C1 shown in FIG. 6. If the mother substrate 110 is fixed to the supporting substrate 100 in the preceding manufacturing process, the supporting substrate 100 may be removed from the mother substrate 110 by a laser ablation process or a thermal rapid annealing process; however, the process is not limited thereto. In the example depicted, the main surface 110B of the mother substrate 110 from which the supporting substrate 100 has been removed is covered with the conductive film CD. Consequently, the organic EL device 1 structured as in FIGS. 1 and 2 can be manufactured. Similarly, the supporting substrates 100 are removed from the mother substrates 110 of the other chips C2 and C3.

In the manufacturing process explained above, electrostatic energy is easily generated because of a contact, friction, and exfoliation between the mother substrate and various manufacturing apparatuses and conveying mechanisms or because of a plasma process such as plasma CVD. If electrostatic energy is charged locally on the mother substrate, electrostatic destruction tends to occur in the switching elements and various wirings. In recent years, the organic EL devices are designed to be more miniaturized and minute, and various circuits including the switching element become smaller and various wirings become narrower. Such miniaturized circuits and wirings are easily destroyed by the electrostatic charge acting thereon because of their small capacitance.

In the present embodiment, even if electrostatic energy is generated in the manufacturing process of the organic EL device 1, the conductive film CD contacting the mother substrate 110 diffuses the electrostatic energy. Therefore, electrostatic energy is not charged locally on the mother substrate 110 during the manufacturing process and electrostatic destruction of various circuits and various wirings can be prevented. Therefore, decrease in the productivity can be suppressed.

Furthermore, the conductive film CD covers the second main surface 10B of the first insulating substrate 10 cut out by the dividing process of the mother substrate 110. Therefore, the organic EL device 1 manufactured as above transmits and diffuses the heat from the array substrate AR to the conductive film CD, and thus, radiation performance of the array substrate AR can be improved.

Furthermore, the organic EL element OLED formed on the first main surface 10A side of the first insulating substrate 10 is of the top-emission type which includes the reflective plate RP at the first insulating substrate 10 side. Therefore, as compared to a structure which includes no reflective plate except a conductive film CD covering the second main surface 10B of the first insulating substrate 10 as a reflective plate, the light emitted from the organic EL element OLED can be reflected by the reflective plate RP to suppress the light reaching the switching elements. Consequently, an erroneous reaction of the switching element caused by the emitted light can be suppressed.

Furthermore, since the conductive film CD covering the second main surface 10B of the first insulating substrate 10 is formed of a lower permeable material, the infiltration of moisture into the first insulating substrate 10 can be suppressed even if the first insulating substrate 10 is formed of a resin material, and deterioration of the organic EL element OLED caused by moisture can be reduced.

Note that, in the process of removing the supporting substrate 100 from the mother substrate 110 explained with reference to FIG. 7, the example is given that the main surface 110B of the mother substrate 110 is covered with the conductive film CD; however, the conductive film CD may be removed from the mother substrate 110 along with the supporting substrate 100. In that case, the organic EL device 1 as manufactured does not include a conductive film CD. However, the conductive film CD is still interposed between the supporting substrate 100 and the mother substrate 110 in the manufacturing process of the organic EL device 1, and the electrostatic energy that occurs in the manufacturing process is diffused by the conductive film CD. Therefore, as in the manufacturing method described above, electrostatic destruction of various circuits and various wirings can be suppressed and the decrease in productivity can be suppressed, too.

Now, another manufacturing method of the organic EL device 1 is explained.

Figure 8:
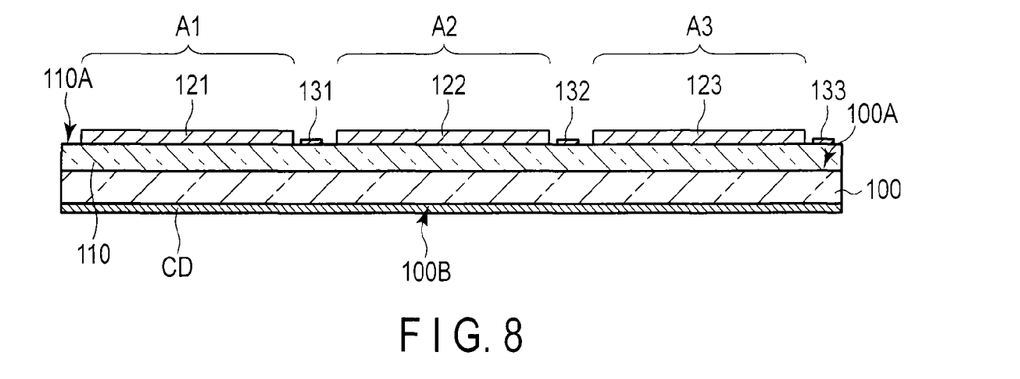
FIG. 8 shows another manufacturing method of the organic EL device 1 and shows a process of disposing a mother substrate 110 on a supporting substrate 100 which is covered with a conductive film.

The example depicted in FIG. 8 differs from the example depicted in FIG. 3 in that the main surface 100B of the supporting substrate 100 is covered with the conductive film CD and that the mother substrate 110 is disposed on the main surface 100A of the supporting substrate 100. The supporting substrate 100 is, for example, glass substrate and the mother substrate 110 is either glass substrate or resin substrate.

A display element unit 121 is formed on a first area A1 on the mother substrate 110, a display element unit 122 is formed on a second area A2 on the mother substrate 110, and a display element unit 123 is formed on a third area A3 on the mother substrate 110. Furthermore, through the formation of the display element units 121 to 123, the mount units 131 to 133 are formed on the mother substrate 110 concurrently.

After this process, the processes depicted in FIGS. 5 to 7 are performed.

The organic EL device 1 manufactured by the above method does not include a conductive film CD. However, since the main surface 100B of the supporting substrate 100 is covered with the conductive film CD in the manufacturing process of the organic EL device 1, electrostatic energy that occurs in the manufacturing process is diffused by the conductive film CD. Therefore, as in the manufacturing method described above, electrostatic destruction of various circuits and various wirings can be suppressed and the decrease in productivity can be suppressed, too.

Now, still another manufacturing method of the organic EL device 1 is explained.

The manufacturing method explained here uses relatively thick glass substrate as a mother substrate 110, and includes a process to polish the mother substrate 110 later in the method.

Figure 9:
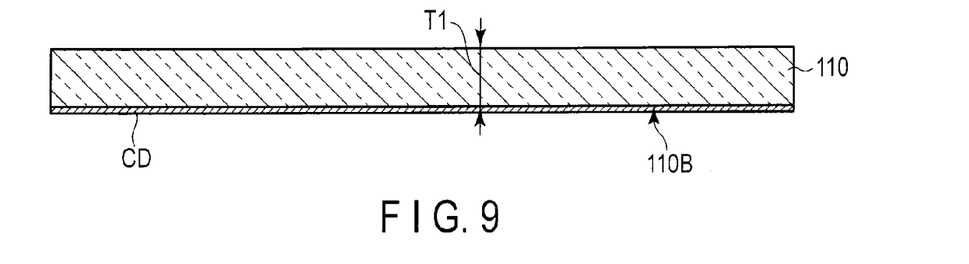
FIG. 9 shows another manufacturing method of the organic EL device 1 and shows a process of preparing the mother substrate 110 which is covered with the conductive film.

As shown in FIG. 9, a mother substrate 110 whose main surface 110B is covered with a conductive film CD is prepared first. The mother substrate 110 is glass substrate having a thickness T1 of 1 mm or less, for example. In this example, thickness T1 of the mother substrate 110 is 0.5 mm.

Figure 10:
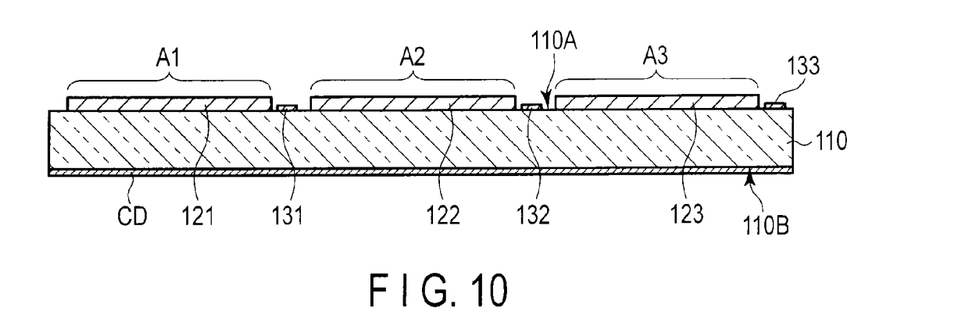
FIG. 10 shown another manufacturing method of the organic EL device 1 and shows a process of forming display element units 121 to 123 and mount units 131 to 133.

Then, as shown in FIG. 10, display element units 121 to 123 and mount units 131 to 133 are formed on the main surface 110A of the mother substrate 110. The display element units and mount units are formed as depicted in FIG. 4.

Figure 11:
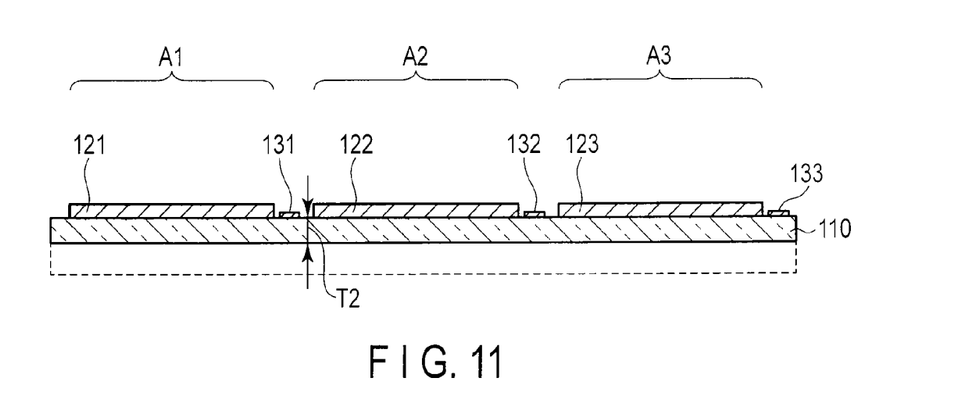
FIG. 11 shows still another manufacturing method of the organic EL device 1 and shows a process of polishing the mother substrate 110.

Then, as shown in FIG. 11, the main surface 110B of the mother substrate 110 is polished until the mother substrate 110 reaches a predetermined thickness. In this example, the mother substrate 110 is polished by chemical etching. The chemical etching is performed using a hydrofluoric acid solution containing 10 wt % or more of hydrogen fluoride as etchant.

Specifically, the hydrofluoric acid solution erodes the conductive film CD first and removes the conductive film CD, and then, the hydrofluoric acid solution erodes the mother substrate 110 from the main surface 110B side until it reaches thickness T2. In this example, thickness T2 of the mother substrate 110 after the polishing is set to approximately 0.15 mm.

Then, as depicted in FIG. 5, the mother substrate 110 is divided into a plurality of chips, and as depicted in FIG. 6, a signal supplier is mounted on a mount unit in each chip. Consequently, the organic EL device 1 can be manufactured.

The organic EL device 1 manufactured by the above method does not include a conductive film CD. That is, the conductive film CD is removed in the polishing process of the mother substrate 110 with the display element units and the like formed thereon. In other words, the conductive film CD remains in the process to form the display element units and the like. Therefore, electrostatic energy that occurs in the process to form the display element units and the like is diffused by the conductive film CD, and electrostatic destruction of various circuits and various wirings can be suppressed.

During the process to form the display element units and the like, electrostatic destruction occurs exceptionally when the electrodes and wirings formed in islands are in the floating state. That is, at the time when the display element units and the like are formed, switching elements are electrically connected to gate lines and source lines, and thus, electric charge tends to be dispersed. Furthermore, at the time when the display element units and the like are formed, short rings to protect the display element units from electrostatic energy may be formed, and thus, electrostatic destruction scarcely occurs. Therefore, even if the conductive film CD is removed after the display element units and the like are formed, the decrease in the productivity caused by the electrostatic destruction can be suppressed.

Now, another structural example of the organic EL device 1 of the present embodiment is explained.

Figure 12:
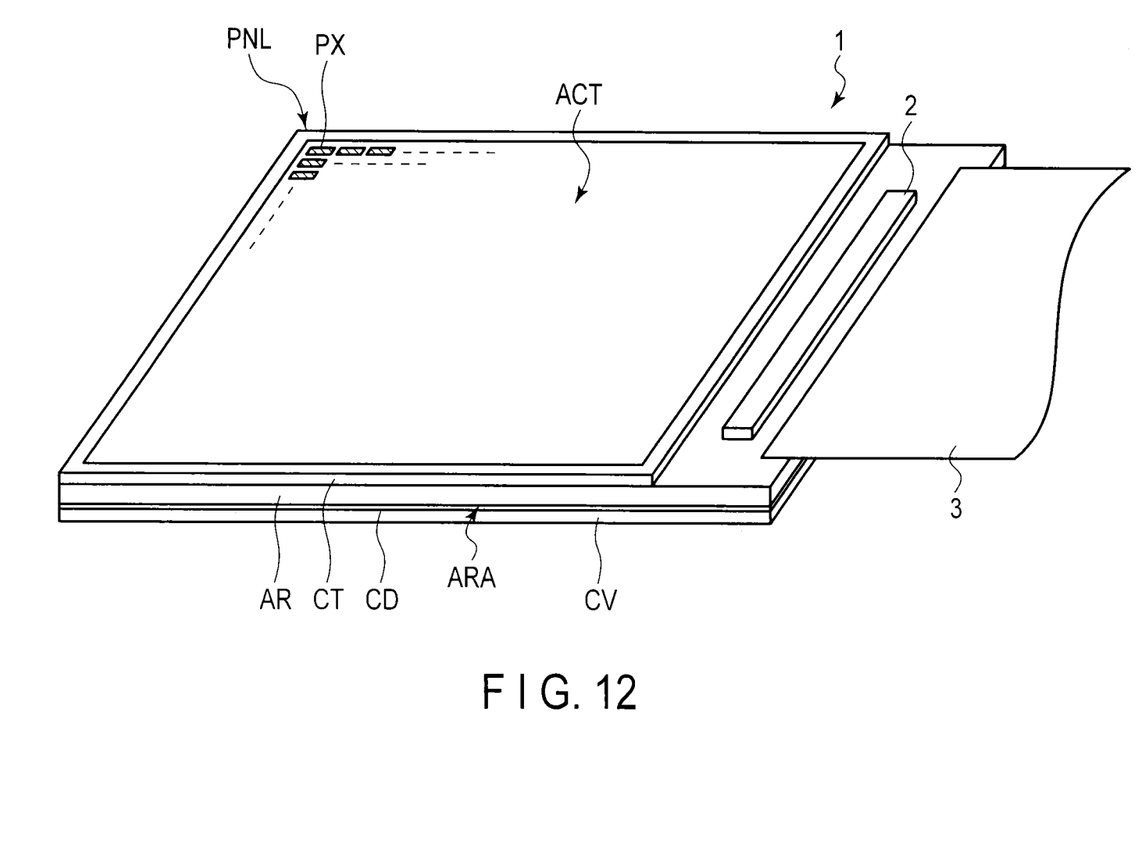
FIG. 12 schematically shows another structural example of the organic EL device 1 of the present embodiment.

FIG. 12 schematically shows another structural example of the organic EL device 1 of the present embodiment.

The organic EL device 1 depicted here differs from that of the FIG. 1 in that an insulating cover CV covering a conductive film CD.

Specifically, the insulating cover CV overlaps the conductive film CD facing the rear surface ARA of the array substrate AR. In the example depicted, the insulating cover CV exposes four end surfaces of the conductive film CD; however, no limitation is intended thereby. That is, the insulating cover CV may covers the entire end surfaces of the conductive film CD. The insulating cover CV may be an inorganic thin film formed of an inorganic material or may be an organic thin film formed of an organic thin film, or may be a multilayer of such inorganic and organic thin films.

The same advantages obtained from the above structural example can be achieved by this structural example. In addition, when the organic EL device 1 with the conductive film CD is incorporated in an electronic device, a short-circuit due to a contact between the conductive film CD and wirings and circuits in the electronic device can be prevented. In recent years, extremely thin electronic devices are trend. That is, a sufficient gap between the organic EL device 1 and the wirings and circuits of the electronic device is harder to secure when the organic EL device 1 is incorporated in the electronic device. However, this structure can prevent a short-circuit caused by the conductive film CD contacting the internal components of the electronic device while maintaining the electronic device thin as required.

As can be understood from the above, the present embodiment can provide an organic EL device which can suppress the decrease in productivity and a manufacturing method of the same.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. An organic EL device comprising:
    an insulating substrate including a first main surface and a second main surface;
    a switching element formed on the insulating substrate at the first main surface side;
    a first electrode electrically connected to the switching element;
    a second electrode opposed to the first electrode;

an organic luminescence layer disposed between the first electrode and the second electrode;

a reflective plate disposed between the insulating substrate and the first electrode;

a conductive film covering the second main surface of the insulating substrate;

an insulating cover covering the conductive film; and a flexible printed circuit board mounted on a first main surface side of the insulating substrate directly above the conductive film.

2. The organic EL device of claim 1, wherein the conductive film contains a high-melting-point metal.

3. The organic EL device of claim 1, wherein the conductive film is formed of a nitride.

4. The organic EL device of claim 1, wherein the conductive film is formed of a high-melting-point metal nitride.

5. The organic EL device of claim 1, wherein the insulating substrate is formed of a resin material.

6. The organic EL device of claim 1, wherein the reflective plate is disposed between the switching element and the first electrode.

7. The organic EL device of claim 1, wherein the insulating cover extends directly below the flexible printed circuit board.

8. The organic EL device of claim 1, further comprising a driving IC chip mounted on the first main surface side of the insulating substrate directly above the conductive film.

9. The organic EL device of claim 8, wherein the insulating cover extends directly below the flexible printed circuit board and the driving IC chip.

10. The organic EL device of claim 1, further comprising a counter-substrate opposed to the first main surface of the insulating substrate, and not opposed to the flexible printed circuit board, wherein the conductive film continuously extends from a position which overlaps the counter-substrate to a position which overlaps the flexible printed circuit board.

* * * * *